United States Patent [19]

Hosaka

[11] Patent Number: 5,030,588
[45] Date of Patent: Jul. 9, 1991

[54] METHOD OF MAKING SEMICONDUCTOR DEVICE WITH FILM RESISTOR

[75] Inventor: Takashi Hosaka, Tokyo, Japan

[73] Assignee: Seiko Instruments Inc., Japan

[21] Appl. No.: 332,810

[22] Filed: Apr. 3, 1989

[30] Foreign Application Priority Data

Apr. 5, 1988 [JP] Japan ............... 63-83932

[51] Int. Cl.⁵ .......................................... H01L 21/70
[52] U.S. Cl. ........................................ 437/60; 437/41;
437/47; 437/51; 437/52; 437/193; 437/200;
437/228; 437/235; 437/918; 357/51
[58] Field of Search .................. 437/47, 60, 918, 200,
437/225, 228, 162, 41, 40, 28; 357/51

[56] References Cited

U.S. PATENT DOCUMENTS

| 4,348,802 | 9/1982 | Shirato | 437/41 |
| 4,391,846 | 5/1983 | Raymond | 252/518 |
| 4,413,403 | 11/1983 | Ariizumi | 437/162 |
| 4,416,049 | 11/1983 | McElroy | 437/47 |
| 4,484,388 | 11/1984 | Iwasaki | 437/28 |
| 4,497,106 | 5/1985 | Momma et al. | 437/59 |
| 4,601,889 | 8/1971 | Kaneoya | 357/51 |
| 4,693,925 | 9/1987 | Cheung et al. | 437/225 |
| 4,786,612 | 11/1988 | Yau et al. | 437/918 |

FOREIGN PATENT DOCUMENTS

| 0029344 | 3/1981 | Japan | 437/918 |
| 0089854 | 5/1983 | Japan | 357/51 |
| 8403587 | 9/1984 | Japan | 437/200 |

OTHER PUBLICATIONS

Roger Allan, "Thin Film Devices on Silicon Chip Withstand Up to 500° C.", Electronics, Jan. 3, 1980, pp. 36-40.

Primary Examiner—Brian E. Hearn
Assistant Examiner—Tom Thomas
Attorney, Agent, or Firm—Bruce L. Adams; Van C. Wilks

[57] ABSTRACT

A method of making a semiconductor device having a film resistive element. A resistive film is deposited over a substrate formed with a first contact hole open to an under-layer electrode region disposed in or on the substrate. The resistive layer is selectively etched to form the film resistive element and at the same time to leave portion of the resistive film disposed in and around the first contact hole. An inter-layer insulating film is then formed over the substrate. The inter-layer insulating film is selectively etched to form a second contact hole open to the film resistive element and at the same time to remove at least portion of the inter-layer insulating film disposed in and around the first contact hole. An over-layer electrode pattern film is formed in contact with the resistive film left in the first and second contact holes.

19 Claims, 3 Drawing Sheets

5,030,588

METHOD OF MAKING SEMICONDUCTOR DEVICE WITH FILM RESISTOR

BACKGROUND OF THE INVENTION

The present invention relates to the method of producing semiconductor devices having thin film resistive elements, and applicable for analog devices etc.

Conventionally, NiCr alloy has been utilized to form general thin film resistive elements. However, since this alloy is not commonly used in semiconductor device, this alloy has not been suitably treated in the fabrication process of semiconductor devices. FIGS. 2A–2D show one example of the conventional method of forming a thin film resistive element with NiCr alloy on a semiconductor substrate. As shown in FIG. 2A, a metal oxide semiconductor (MOS) element is formed on a semiconductor substrate 21 within an area surrounded by field oxide films 22. The MOS element is comprised of a gate insulating film 23, a gate electrode 24, a drain region 25 and a source region 26. Then, an intermediate insulating film 27 is formed over the substrate 21. As shown in FIG. 2B, a thin resistive film composed of, for example, NiCr alloy is superposed on the intermediate insulating film 27 and etched to form a thin film resistive element 28. Next, as shown in FIG. 2C, an inter-layer insulating film is formed over the resistive element 28. Thereafter, the intermediate insulating film 27 and inter-layer insulating film are etched to form contact holes 29 to the thin film resistive element 28 and other contact holes 30 to the semiconductor element. However, these contact holes can not be formed concurrently in general, but must be formed separately, because the total thickness of insulating film over the thin film resistive element 28 is thinner than that of the insulating film over the semiconductor element. If dry etching were utilized to concurrently form the contact holes, the thin film resistive element 28 would be also etched after the thinner insulating film was removed therefrom. On the other hand, if wet etching were utilized to form the contact holes, the contact holes 30 to the semiconductor element would be broadened too much to thereby impare the micro structure of the semiconductor device. Therefore, the contact holes must be formed separately by two steps. Lastly as shown in FIG. 2D, an electrode pattern film 31 composed of aluminum (Al) etc. is formed on the substrate 21.

During the step of FIG. 2C, the substrate can not be subjected to the usual heating process above 800° C. to carry out contact reflow, because such a heating process would cause deterioration of the NiCr alloy. Accordingly, the contact holes 30 to the semiconductor element is left deep and steep so that the electrode pattern film 31 can not properly cover step or edge portions of the contact holes 30 to thereby increase the possibility of forming an open-circuit.

As described above, the conventional method of forming the thin film resistive element is not effectively applied to the conventional semiconductor device. Such application would cause decrease in yield rate, and would not permit the micro process of semiconductor fabrication. In addition, the material of the thin film resistive element itself is not commonly used in the semiconductor process, and therefore the use of such material may affect the characteristics of semiconductor device.

SUMMARY OF THE INVENTION

In order to remove the above-mentioned drawbacks of the prior art method, an object of the present invention is to utilize tungsten silicide ($WSi_x$) for thin film resistive elements, which can be suitably treated in the semiconductor fabrication process. Another object of the present invention is to provide tungsten silicide film in the contact holes open to the semiconductor element.

According to the present invention, $WSi_x$ film is deposited to form the thin film resistive film, and at the same time, is applied as an under-layer relative to an over-layer electrode pattern film. In particular, the $WSi_x$ film is interposed between the electrode region of the semiconductor element, such as transistor, and the over-layer electrode pattern film within the contact hole. More specifically, after forming contact holes open to the source and drain regions of the transistor, the $WSi_x$ film is deposited over the substrate at a relatively small thickness below 2000Å and then is patterned to form a thin film resistive element. At this time, at least a portion of the $WSi_x$ film over which the over-layer electrode pattern film is to be formed is not removed and therefore left (except the portion surrounding the patterned thin film resistive element). It is particularly important to leave the $WSi_x$ film within the contact holes. Next, an inter-layer insulating film is formed over the substrate, and then removed partly to form contact holes open to the thin film resistive element and to expose the $WSi_x$ film on which an over-layer electrode pattern film is to be formed. Lastly, the over-layer electrode film is deposited over the substrate and patterned in a desired shape. Thereafter, the substrate is treated in a manner similar to the ordinary semiconductor fabrication process.

According to the present invention, since the $WSi_x$ film is suitable for and matched with the silicon semiconductor fabrication process and has stable characteristics, it is possible to maintain a yield rate comparable to that of the conventional semiconductor fabrication process and to achieve a certain reliability. Further, since the thermally stable thin film resistive element is formed after forming the contact holes to the semiconductor element, the contact reflow process can be carried out to reduce the sharpness and steepness of the contact holes to thereby avoid cutting of the electrode pattern film made of material such as aluminum.

DETAILED DESCRIPTION OF THE INVENTION

The basic feature of the present invention is such that, after forming contact holes, a resistive thin film is formed over the substrate, and then etched to form a thin film resistive element and to leave the resistive thin film in the contact holes, and thereafter an electrode pattern film is formed on the resistive film in the method of making the semiconductor device.

FIGS. 1A–1G show one embodiment of the inventive method in which $WSi_x$ film is utilized as the thin resistive film to form a thin film resistive element in combination with a metal oxide film semiconductor (MOS) element such as transistor on the silicon substrate.

Figure 1A:
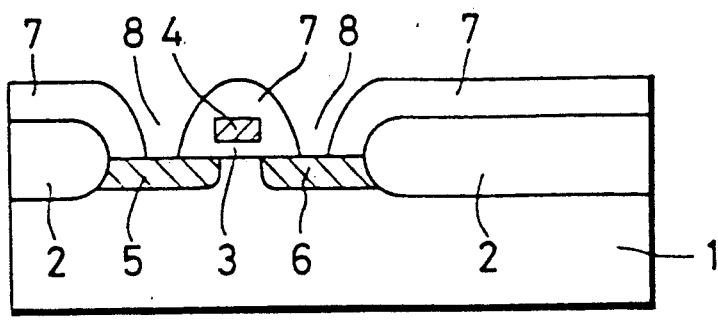
FIGS. 1A–1G are sequential sectional views showing steps of the method of making semiconductor devices according to the present invention.

FIG. 1A shows a step of forming contact holes on the MOS type semiconductor device. Namely, a field oxide film 2 is formed on the silicon semiconductor substrate 1 for isolation of individual elements from each other. Then, a gate insulating film 3, a gate electrode 4, a source electrode region 5 and a drain electrode region 6 are formed within an area surrounded by the field oxide 2 film to form an individual semiconductor element. Further, an intermediate insulating film 7 is deposited and etched to form contact holes 8 to expose part of the source and drain electrode regions 5 and 6 for electrical connection.

Figure 1B:
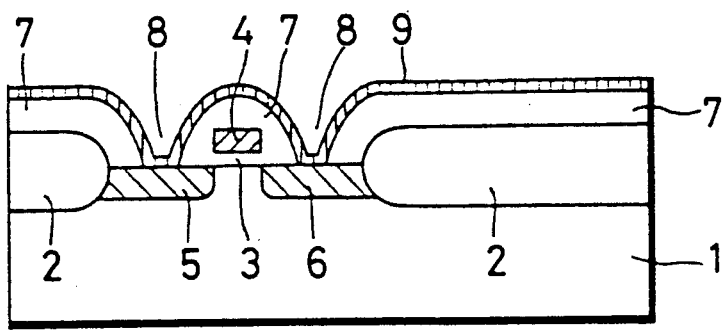

Next referring to FIG. 1B, tungsten silicide ($WSi_x$) film 9 is deposited over the substrate 1. The $WSi_x$ film has a thickness less than 2000Å and has a certain composition ratio indicated by the suffix X. The value of X may be selected in the relatively wide range of 1 to 10. The value of X should be determined according to the requirement for the thin film resistive element added to the semiconductor device. The $WSi_x$ film can be formed by the chemical vapor deposition (CVD) method or the physical vapor deposition (PVD) method such as sputtering and evaporation.

Figure 1C:
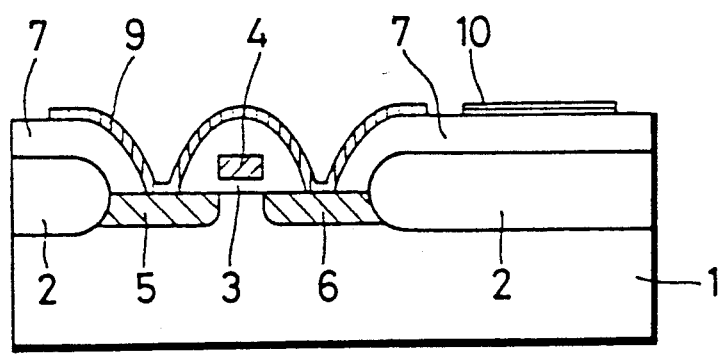

Referring to FIG. 1C, the resistive film 9 is patterned by photolithography to form a thin film resistor or resistive element 10. A dry etching method can be used during the patterning to achieve relatively high pattern accuracy. At the same time, a portion of the $WSi_x$ film other than that surrounding the resistive element 10 is left on the substrate. Particularly, it is essential to leave the portion of $WSi_x$ in and around the contact holes 8.

Figure 1D:
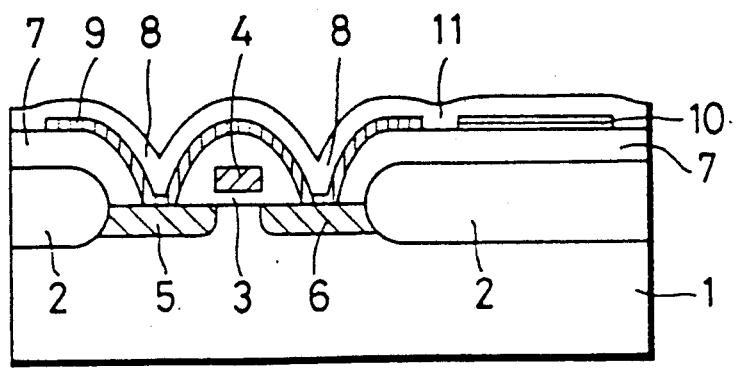

Further, referring to FIG. 1D, an inter-layer insulating film 11 is formed over the substrate. The inter-layer insulating film 11 is generally deposited by the CVD method, but the PVD method may be also applicable. The inter-layer insulating film 11 is provided to electrically insulate the resistor or resistive element 10 from a later-formed electrode pattern film 12 composed of Al etc., and therefore has a thickness of $0.1\mu$ to $2.0\mu$. The inter-layer insulating film 11 is composed generally of silicon dioxide ($SiO_2$) such as non-doped silicate glass (NSG), phosphorus-doped silicate glass (PSG), boron-phosphorus-doped silicate glass (BPSG) and boron-doped silicate glass (BSG), or silicon nitride (SiN), or silicon oxynitride (SiON).

Figure 1E:
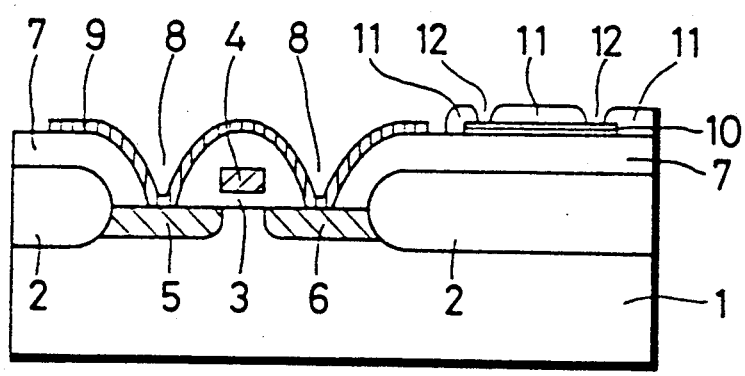

Next referring to FIG. 1E, the inter-layer insulating film 11 is etched such as by photolithography to form contact holes 12 to expose parts of the thin film resistive element 10. At the same time, the portion of the inter-layer insulating film 11 other than around the resistive element 10 is also etched and removed. Particularly, since the contact holes 12 to the thin film resistive element 10 are not needed to be precise, the inter-layer insulating film 11 can be removed by the wet etching as well as the dry etching. It is important not to over-etch the $WSi_x$ film 9 during the etching of inter-layer insulating film 11. In this regard, the inter-layer insulating film 11 should be composed of $SiO_2$, SiON or SiN and etching liquid composed of hydrofluoric acid solution should be used so as to avoid over-etching of the adjacent $WSi_x$ film 9 to thereby form good contact holes 12 and to thereby completely remove the inter-layer insulating film 11 from the previously formed contact holes 8. The contact holes 8 are not changed because they are covered with the $WSi_x$ film 9.

Figure 1F:
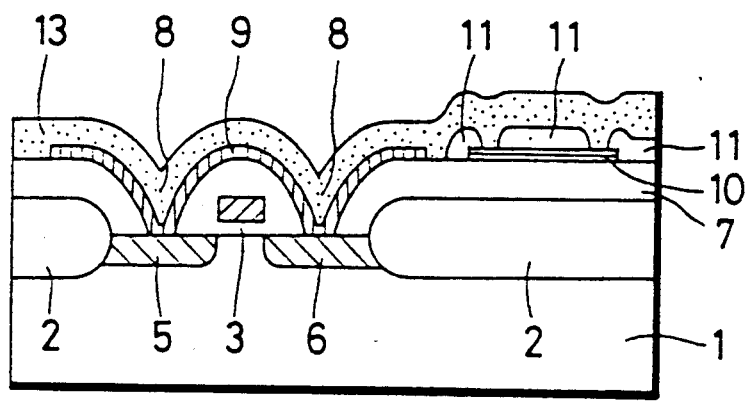

Next referring to FIG. 1F, a metal electrode film 13 is formed over the substrate. The metal electrode film 13 is composed of aluminum or its alloy such as Al-Si, Al-Si-Cu and Al-Si-Ti. Other metal materials can be used as the metal film 13.

Figure 1G:
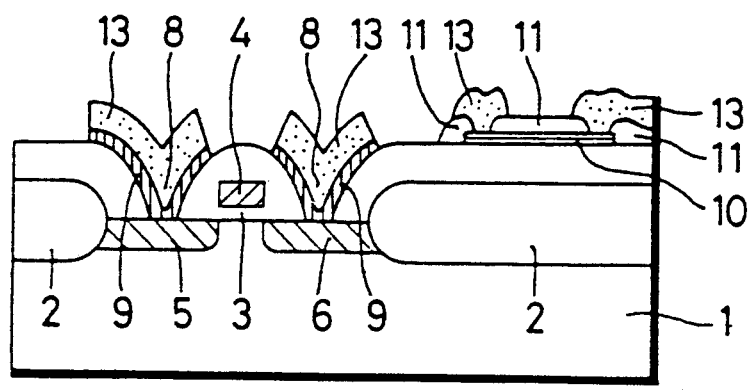
Figure 2A:
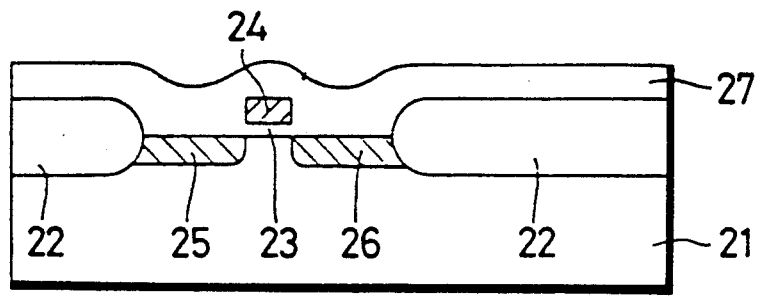
FIGS. 2A–2D are sequential sectional views showing steps of the conventional method of making semiconductor devices.
Figure 2B:
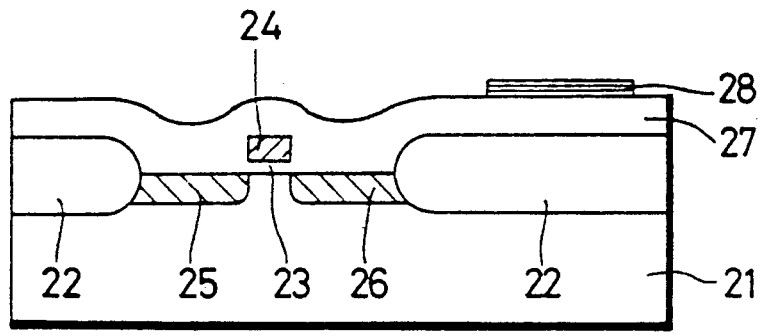
Figure 2C:
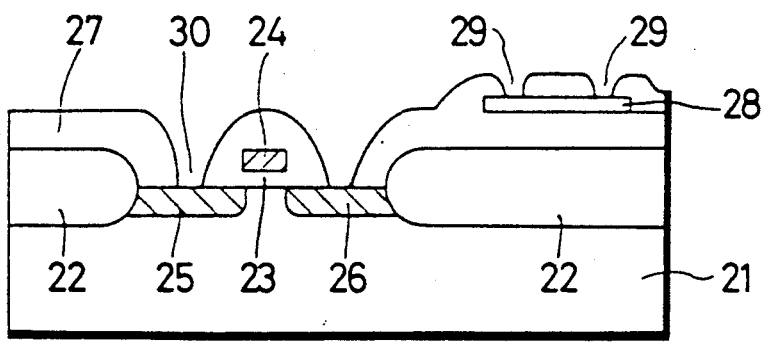
Figure 2D:
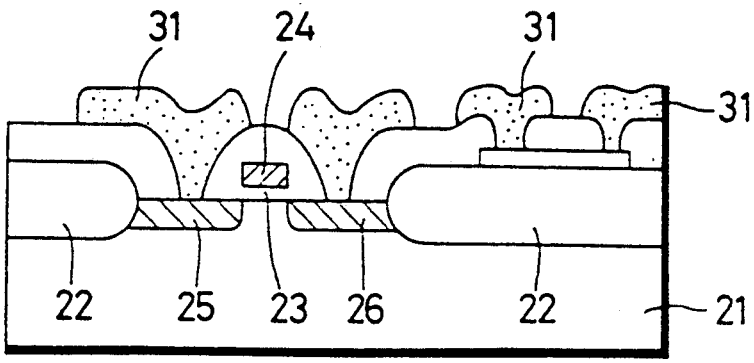

Lastly, referring to FIG. 1G, the metal film 13 is patterned to form electrode pattern films effective to electrically connect between separate electrode regions of individual elements through their contact holes. The electrode film 13 composed of aluminum has good adhesion to the under-layer $WSi_x$ film 9 to thereby avoid removal of the electrode film 13 from the $WSi_x$ film 9. In addition, the $WSi_x$ film 9 is concurrently etched during the patterning process of the electrode film 13 as shown in FIG. 1G. Since the thickness of the $WSi_x$ film 9 is much smaller than that of the electrode film 13, the $WSi_x$ film 9 is easily concurrently etched with the electrode film 13 to thereby form fine micro patterns.

By using the resistive film composed of $WSi_x$ and by employing the method illustrated in FIGS. 1A-1G, it is possible to fabricate the semiconductor device having additional thin film resistive elements without substantially changing the process and device parameters of the conventional semiconductor fabrication method. Further, since the $WSi_x$ film has excellent adhesiveness to the silicon substrate and to the electrode pattern film composed of such as aluminum, it is possible to produce the semiconductor device a having stable and reliable thin film resistive element.

Moreover, during the steps of FIGS. 1A-1G, thermal treatment can be carried out to stabilize the thin film resistive element. Such thermal treatment may be conducted after either of the steps of FIG. 1B, FIG. 1C, FIG. 1D, FIG. 1E, FIG. 1F and FIG. 1G. Further, if the etching rate of the electrode film 13 is sufficiently greater than that of the resistive thin film 9, the inter-layer insulating film 11 can be eliminated. However, in such a case, the $WSi_x$ film 9 under the electrode film 13 must be etched and removed separately from the electrode film 13 according to different etching method.

The thin resistive film composed of $WSi_x$ is utilized in the method shown by FIGS. 1A-1G; however, other materials such as NiCr can be used for the resistive film in the present invention.

The contact holes are formed with respect to the source and drain electrode regions formed in the silicon substrate in the above described embodiment. However, the inventive method can be applicable to a polysilicon substrate, and to other substrate having formed thereon pattern electrode regions composed of metal such as Al, W and Mo and of silicide such as $WSi_x$, $TiSi_x$, $MoSi_x$ and $TaSi_x$.

Moreover, the above described embodiment relates to a MOS type semiconductor device; however, the present invention can be applicable to metal-semiconductor (MES) type semiconductor device made of compound semiconductor, metal-insulated semiconductor (MIS) type semiconductor devices, and also bipolar type semiconductor devices.

As described above, according to the present invention, since the $WSi_x$ film is utilized, which is suitable and matched with the silicon semiconductor fabrication process, it is possible to maintain the high yield rate and reliability comparable to the semiconductor device having no resistive element. Since, after forming contact holes to the semiconductor element, the thin film resistive element is formed on the substrate, it is possible to carry out the contact reflow process so as to reduce the sharpness of the edge portion of the contact holes or to reduce the slanting degree of the contact hole side walls, thereby avoiding open-circuit of the aluminum electrode pattern film. Further, since the $WSi_x$ film is left around and in the contact holes, it is possible to effectively avoid transition of silicon to the electrode pattern film, which could occur in the conventional contact hole structure utilizing aluminum electrode film, thereby reducing the contact resistance to realize a fast operating element. The junction destruction due to aluminum spike is also eliminated. Shallow junctions (shallow source and drain) can be formed to increase the reliability and to produce micro elements.

What is claimed is:

1. A method of making a semiconductor device having a film resistor element, comprising the steps of:
   providing a substrate formed with a first contact hole open to an under-layer electrode region;
   depositing a resistive film over the substrate;
   selective etching the resistive film to form a film resistor element and to leave a portion of the resistive film disposed in and around the first contact hole;
   forming an inter-layer insulating film over the substrate;
   selectively etching the inter-layer insulating film to form a second contact hole open to the film resistor element and to remove at least a portion of the inter-layer insulating film disposed in and around the first contact hole; and
   forming an over-layer electrode pattern film in contact with the resistive film left in the first and second contact holes by depositing an electrode film over the substrate, and selectively etching the electrode film concurrently with the resistive film to form the over-layer electrode pattern film.

2. A method according to claim 1; including the step of carrying out a reflow process to round the edge of the first contact hole.

3. A method according to claim 1; wherein the over-layer electrode pattern film composed is of metal containing aluminum.

4. A method according to claim 1; wherein the step of depositing comprises depositing a resistive film composed of NiCr.

5. A method according to claim 1; wherein the step of depositing a resistive film comprises depositing a resistive film composed of tungsten silicide at a thickness of less that 2000Å.

6. A method of claim 5; wherein the step of depositing comprises depositing the resistive film composed of $WSi_x$ where the value of x is set within the range of 1 to 10.

7. A method of making a semiconductor device having a film resist or element, comprising the steps of:
   providing a substrate having an electrode region which is exposed through a first contact hole;
   depositing a resistive film over the substrate and in and around the first contact hole;
   selectively etching the resistive film to leave a portion thereof which defines a film resist or element and to leave another portion thereof in and around the first contact hole;
   forming an inter-layer insulating film over the substrate, the inter-layer insulating film extending over the film resistive element and over the resist or film which remains in and around the first contact hole;
   selectively etching the inter-layer insulating film to form a second contact hole open to the film resist or element and to remove at least the portion of the inter-layer insulating film disposed in and around the first contact hole to expose the resistive film in the region of the first contact hole;
   depositing an electrode film on the substrate, the electrode film extending in and around the second contact hole and over the exposed film resistor element; and
   selectively etching the electrode film concurrently with the resistive film to form an electrode film pattern in contact with the film resistor element through the second contact hole and in contact with the resistive film through the first contact hole.

8. A method according to claim 7; wherein the step of depositing an electrode film comprises depositing an electrode film having a thickness sufficiently greater than that of the depositing resistive film to enable both films to be concurrently etched.

9. A method according to claim 7; wherein the step of depositing a resistive film comprises depositing a resistive film composed of $WSi_x$.

10. A method according to claim 9, wherein the resistive film has a thickness less than 2000Å.

11. A method according to claim 10; wherein the value of x in the $WSi_x$ composition is in the range of 1 to 10.

12. A method according to claim 9; wherein the step of depositing a resistive film comprises depositing the resistive film composed of $WSi_x$ by chemical vapor deposition.

13. A method according to claim 9; wherein the step of depositing a resistive film comprises depositing a resistive film composed of $WSi_x$ by physical vapor deposition.

14. A method according to claim 7; wherein the step of depositing a resistive film comprises depositing a resistive film composed of NiCr.

15. A method of claim 7; wherein the step of forming an inter-layer insulating film comprises forming an inter-layer insulating film having a thickness in the range of $0.1\mu$ to $2.0\mu$.

16. A method according to claim 7; wherein the step of forming an inter-layer insulating film comprises forming an inter-layer insulating film selected from the group consisting of silicon dioxide, silicon nitride and silicon oxynitride.

17. A method according to claim 16; wherein the step of selectively etching the inter-layer insulating film using a hydrofluoric acid solution.

18. A method according to claim 7; wherein the step of depositing an electrode film comprises depositing an electrode film composed of aluminum or aluminum alloy.

19. A method according to claim 18; wherein the step of depositing a resistive film comprises depositing a resistive film composed of tungsten silicide.

* * * * *